(12) United States Patent
Shen

(10) Patent No.: US 7,694,720 B2
(45) Date of Patent: Apr. 13, 2010

(54) SECTIONAL MODULAR HEAT SINK

(75) Inventor: Ching-Hang Shen, Sinjhuang (TW)

(73) Assignee: Aisa Vital Components Co., Ltd., Taipei County (TW)

( * ) Notice: Subject to any disclaimer, the term of this patent is extended or adjusted under 35 U.S.C. 154(b) by 0 days.

(21) Appl. No.: 12/215,133

(22) Filed: Jun. 25, 2008

(65) Prior Publication Data

US 2009/0195986 A1  Aug. 6, 2009

(30) Foreign Application Priority Data

Feb. 1, 2008  (TW) .............................. 97202200 U

(51) Int. Cl.
*H05K 7/20* (2006.01)

(52) U.S. Cl. ..................... 165/80.3; 361/710

(58) Field of Classification Search ................ 165/80.2, 165/80.3, 185; 206/519, 520
See application file for complete search history.

(56) References Cited

U.S. PATENT DOCUMENTS

| 1,944,827 | A | * | 1/1934 | Osherman et al. ........... 206/511 |
| 3,526,195 | A | * | 9/1970 | Maryonovich ............. 108/53.1 |
| 3,695,280 | A | * | 10/1972 | Sturgeon ................. 134/166 R |
| 3,817,420 | A | * | 6/1974 | Heisler ........................ 220/790 |
| 4,076,202 | A | * | 2/1978 | McConnell .............. 248/188.2 |
| 4,444,332 | A | * | 4/1984 | Widen et al. ................. 220/792 |
| 5,900,670 | A | * | 5/1999 | Schneider et al. ........... 257/718 |
| 6,520,248 | B2 | * | 2/2003 | Gailus et al. ................ 165/80.3 |
| 6,637,109 | B2 | * | 10/2003 | Nyqvist ................... 29/890.03 |
| 2001/0001777 | A1 | * | 5/2001 | Webber et al. .............. 482/101 |
| 2003/0082986 | A1 | * | 5/2003 | Wiens et al. ................. 446/120 |
| 2005/0128755 | A1 | * | 6/2005 | Matts et al. .................. 362/368 |

FOREIGN PATENT DOCUMENTS

EP        0867937        9/1998

* cited by examiner

*Primary Examiner*—Allen J Flanigan

(57) ABSTRACT

A sectional modular heat sink is formed from a plurality of stacked modular heat radiating units, each of which is provided on one side along each longitudinal edge with an upright ridge portion having two inclined sidewalls, at least one of which being provided with a groove; and on an opposite side with a channel corresponding to the ridge portion to have two inclined sidewalls, at least one of which being provided with a flange corresponding to the groove on the ridge portion. A plurality of the modular heat radiating units may be sequentially stacked and connected through engagement of the ridge portions and the grooves on a first modular heat radiating unit with the channels and the flanges on a second modular heat radiating unit, respectively, and thereby form a sectional modular heat sink.

2 Claims, 8 Drawing Sheets

US 7,694,720 B2

SECTIONAL MODULAR HEAT SINK

FIELD OF THE INVENTION

The present invention relates to a sectional modular heat sink, and more particularly to a heat sink formed from a plurality of modular heat radiating units.

BACKGROUND OF THE INVENTION

An electronic apparatus generally includes an enclosure to define a closed inner space, within which a plurality of different electronic elements work for the electronic apparatus to operate. These electronic elements produce heat during work. Therefore, elements capable of dissipating heat produced by the electronic elements must be additionally provided in the electronic apparatus to help in cooling the heat-producing electronic elements. Heat sink is one example of such heat dissipating elements. The conventional heat sink is normally made of a metal material having high heat conductivity. In the past, a big-scale heat sink is manufactured by way of casting or forging. To manufacture the heat sink by casting or forging, it is necessary to develop a big-size mold, which is not only heavy and inconvenient to manufacture and transport, but also expensive and non-economic for use.

EP 0867937 discloses a sectional modular lamellar heat dissipator for electronic circuits. Please refer to FIGS. 1 and 2 that are exploded and assembled perspective views, respectively, showing the sectional modular lamellar heat dissipator 1 disclosed in EP 0867937. As shown, the heat dissipator 1 is assembled from a plurality of modular heat radiating units 11 made of extruded aluminum. Each of the heat radiating units 11 is formed on a first plane 111, say, a top surface, along each of two longitudinal edges with two parallelly extended fins 1111, and on a second plane opposite to the first plane 111 with a V-shaped groove 1112 corresponding to the two fins 1111. To stack and assemble two modular heat radiating units 11 together, the parallel fins 1111 on a lower one of the two units 11 are forced into the V-shaped grooves 1112 on an upper one of the two units 11. At this point, the parallel fins 1111 are deformed corresponding to the configuration of the V-shaped grooves 1112, so that the two modular heat radiating units 11 are connected to each other. Other modular heat radiating units 11 may be sequentially stacked in the same manner. With the sectional modular lamellar heat dissipator 1, the problem of heavy and expensive mold for casting or forging a big-scale heat sink is solved. However, the sectional modular lamellar heat dissipator 1 has some disadvantages in practical use thereof. When the fins 1111 are forced into the V-shaped grooves 1112 and deformed, stress concentration will occur at a neck portion of the fins 1111 in contact with the first plane 111. As a result, two modular heat radiating units 11 that have been connected to each other through engagement of the fins 1111 with the V-shaped grooves 1112 are still subject to separation due to broken fins 1111. Further, it is also possible the fins 1111 are not smoothly and fully forced into the V-shaped grooves 1112, and two modular heat radiating units 11 are not fully closely attached to each other. That is, there might be voids between the fins 1111 and the V-shaped grooves 1112 to cause thermal choking. Moreover, since the fins 1111 are deformed under external force, they are not repeatedly usable.

In brief, the conventional sectional modular heat sink 1 has the following disadvantages: (1) the modular heat radiating units have a connecting structure that is subject to breaking to thereby cause separation of two assembled modular heat radiating units from one another; (2) the modular heat radiating units could not be fully tightly connected and closely attached to one another to thereby cause thermal choking between them; (3) stress concentration tends to occur at deformed areas on the modular heat radiating units; (4) the modular heat radiating units have poor structural strength; and (5) the modular heat radiating units are not repeatedly usable.

It is therefore tried by the inventor to develop a sectional modular heat sink assembled from a plurality of improved modular heat radiating units.

SUMMARY OF THE INVENTION

A primary object of the present invention is to provide a sectional modular heat sink formed from a plurality of modular heat radiating units, which can be easily manufactured at reduced cost while enable stable and firm connection to one another to form the sectional modular heat sink.

To achieve the above and other objects, the sectional modular heat sink according to the present invention is formed by sequentially stacking and connecting a plurality of modular heat radiating units to one another. Each of the modular heat radiating units is provided on one side along each longitudinal edge with an upright ridge portion having two inclined sidewalls, at least one of which being provided with a groove or a flange; and on an opposite side with a channel corresponding to the ridge portion to have two inclined sidewalls, at least one of which being provided with a flange or a groove corresponding to the groove or the flange on the ridge portion. The inclined sidewalls of the channel have the same gradient as the inclined sidewalls of the ridge portion.

A plurality of the modular heat radiating units may be sequentially stacked and connected through engagement of the ridge portions and the grooves/flanges on a first modular heat radiating unit with the channels and the flanges/grooves on a second modular heat radiating unit, respectively, and thereby form a sectional modular heat sink.

The sectional modular heat sink according to the present invention provides the following advantages: (1) the modular heat radiating units have simplified structure and can be easily manufactured; (2) the modular heat radiating units may be tightly connected to closely attach to one another; (3) the modular heat radiating units can be quickly assembled together to form the heat sink; (4) the modular heat radiating units have high structural strength; and (5) the modular heat radiating units may be manufactured at reduced cost and high productivity.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
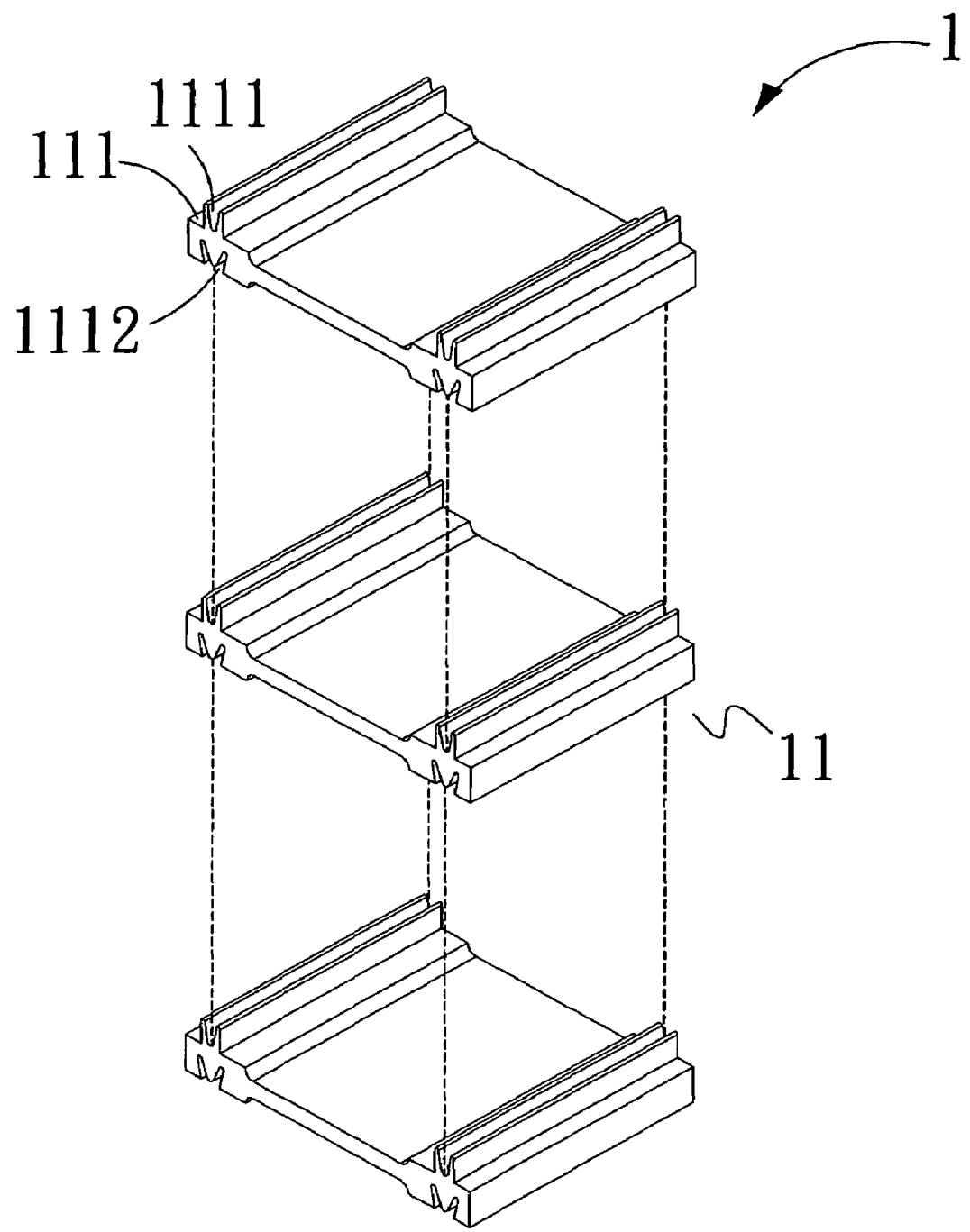
FIG. 1 is an exploded perspective view of a conventional sectional modular lamellar heat dissipator.
Figure 2:
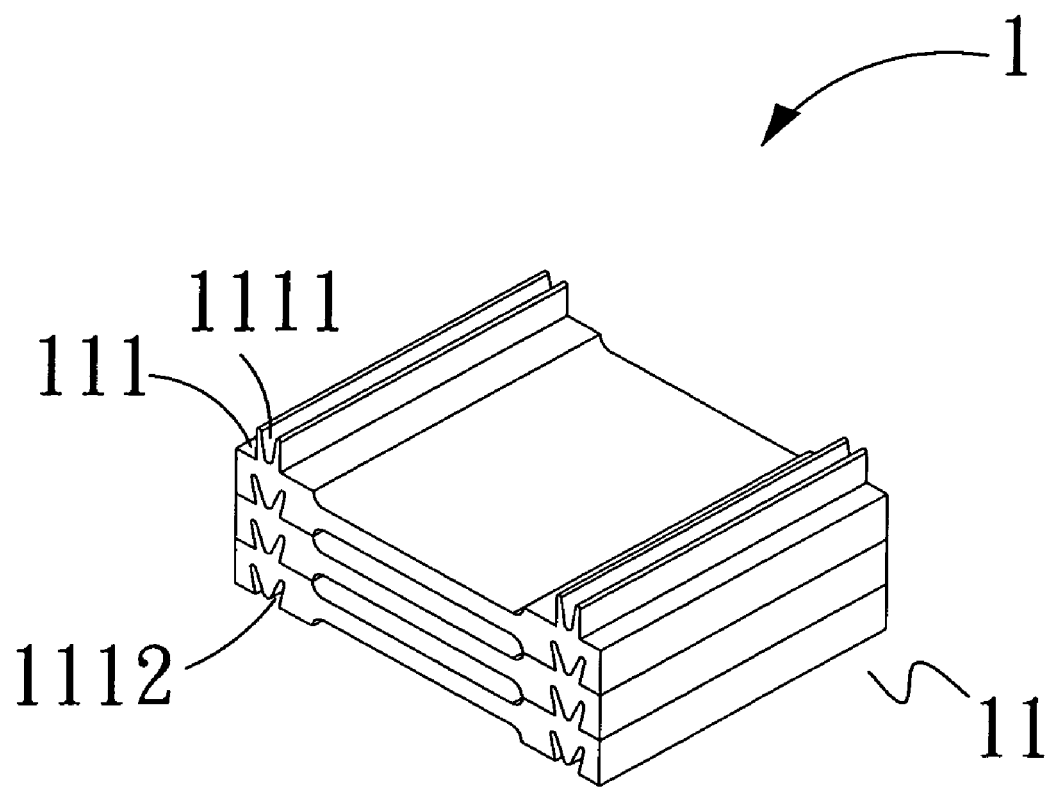
FIG. 2 is an assembled view of FIG. 1.
Figure 3:
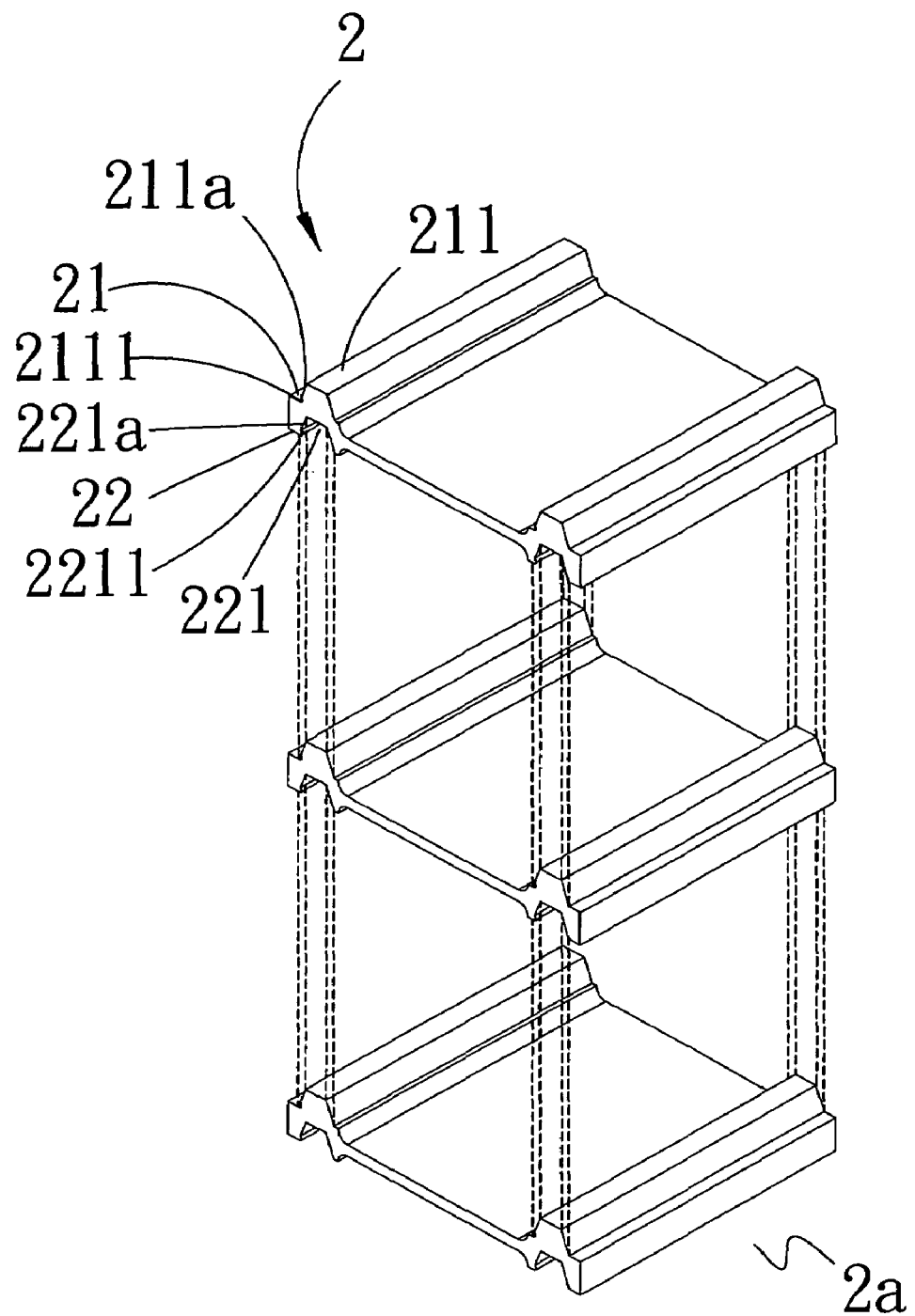
FIG. 3 is an exploded perspective view of a sectional modular heat sink assembled from a plurality of modular heat radiating units according to a first embodiment of the present invention.
Figure 4B:
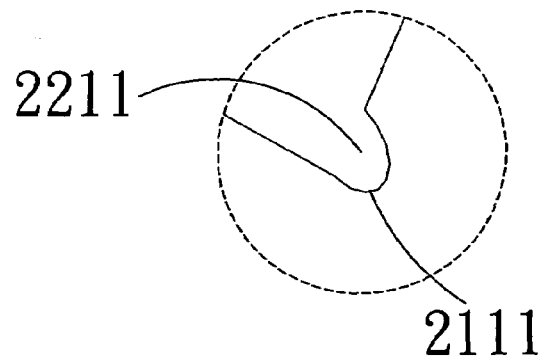
FIG. 4B is an enlarged view of the circled area 4B in FIG. 4.
Figure 4:
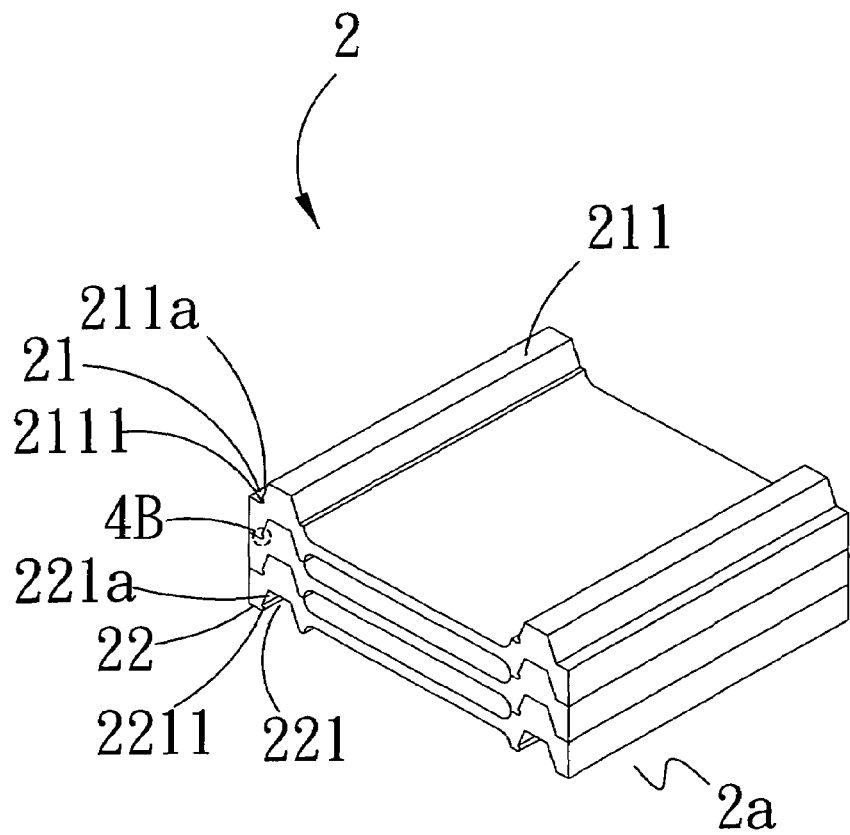
FIG. 4 is an assembled view of FIG. 3.

Please refer to FIGS. 3 and 4 that are exploded and assembled perspective views, respectively, of a sectional modular heat sink 2 according to a first embodiment of the present invention, and to FIG. 4B that is an enlarged view of the circled area 4B in FIG. 4. As shown, the sectional modular heat sink 2 is assembled from a plurality of modular heat radiating units 2a.

Each of the modular heat radiating units 2a is a flat long member being provided on a first plane 21, say, an upper surface thereof, along each of two longitudinal edges with at least one upright ridge portion 211. The ridge portion 211 has two downward and outward inclined sidewalls 211a, and is provided along a lower edge of at least one of the two inclined sidewalls 211a with a groove 2111. The modular heat radiating unit 2a is further provided on a second plane 22 opposite to the first plane 21 with a channel 221 corresponding to each of the ridge portions 211. That is, each of the channels 221 has two inclined sidewalls 221a having a gradient the same as that of the inclined sidewalls 211a of the ridge portion 211. At least one of the two inclined sidewalls 221a of the channel 221 is provided along a lower edge with a flange 2211 corresponding to the groove 2111 on the ridge portion 211. Therefore, through engagement of the ridge portions 211 and the grooves 2111 of a first modular heat radiating unit 2a with the channels 221 and the flanges 2211 of a second modular heat radiating unit 2a, respectively, the two modular heat radiating units 2a may be stacked and connected to one another. In the same manner, a plurality of the modular heat radiating units 2a may be sequentially and continuously stacked and assembled together to form the sectional modular heat sink 2. The modular heat radiating units 2a having the ridge portions 211 with the grooves 2111 and the channels 221 with the flanges 2211 can be more quickly, firmly, and stably assembled to one another to thereby exactly overcome the disadvantages in the conventional sectional modular lamellar heat dissipator 1.

Figure 5:
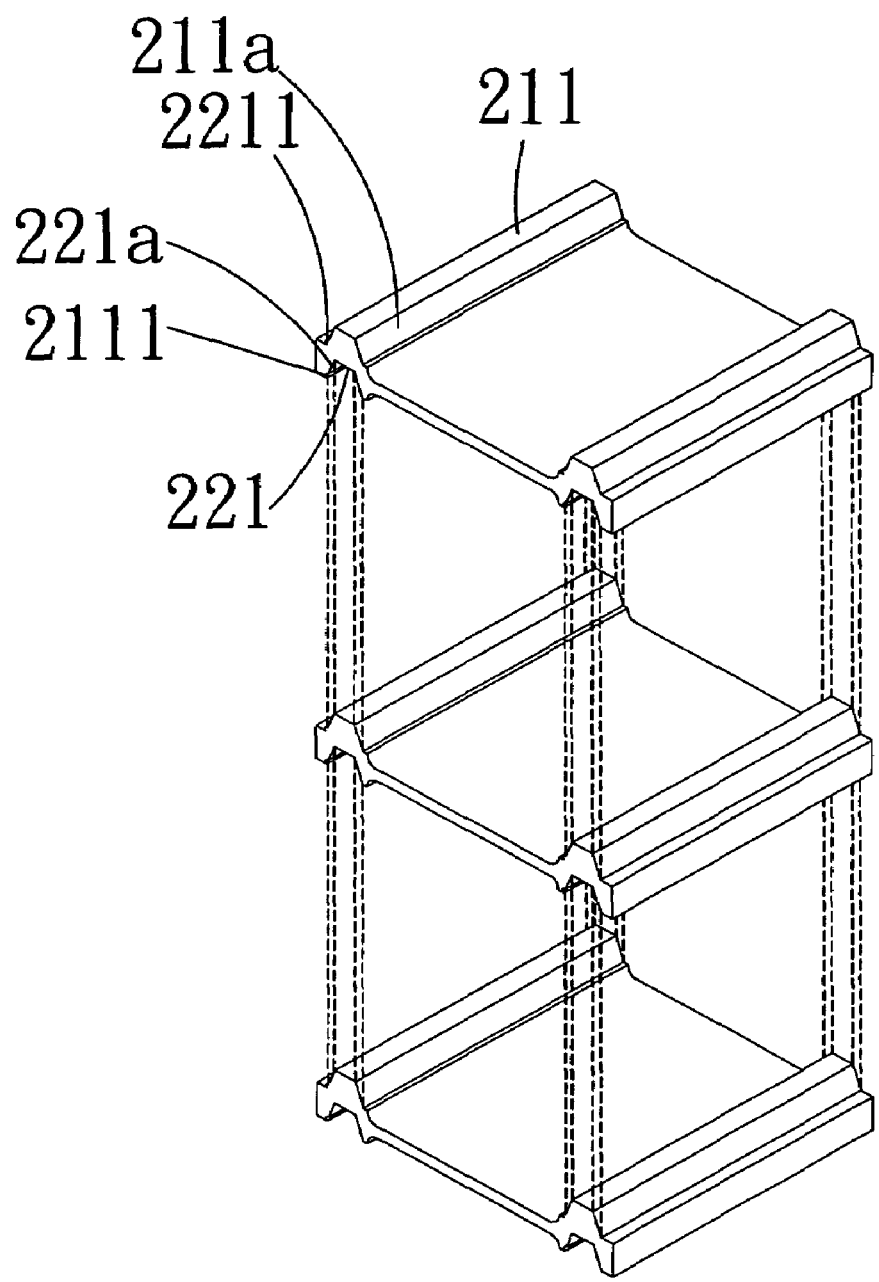
FIG. 5 is an exploded perspective view of a sectional modular heat sink assembled from a plurality of modular heat radiating units according to a second embodiment of the present invention.
Figure 6A:
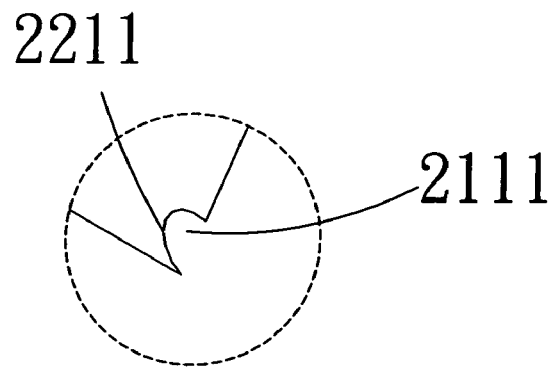
FIG. 6A is an enlarged view of the circled area 6A in FIG. 6.
Figure 6:
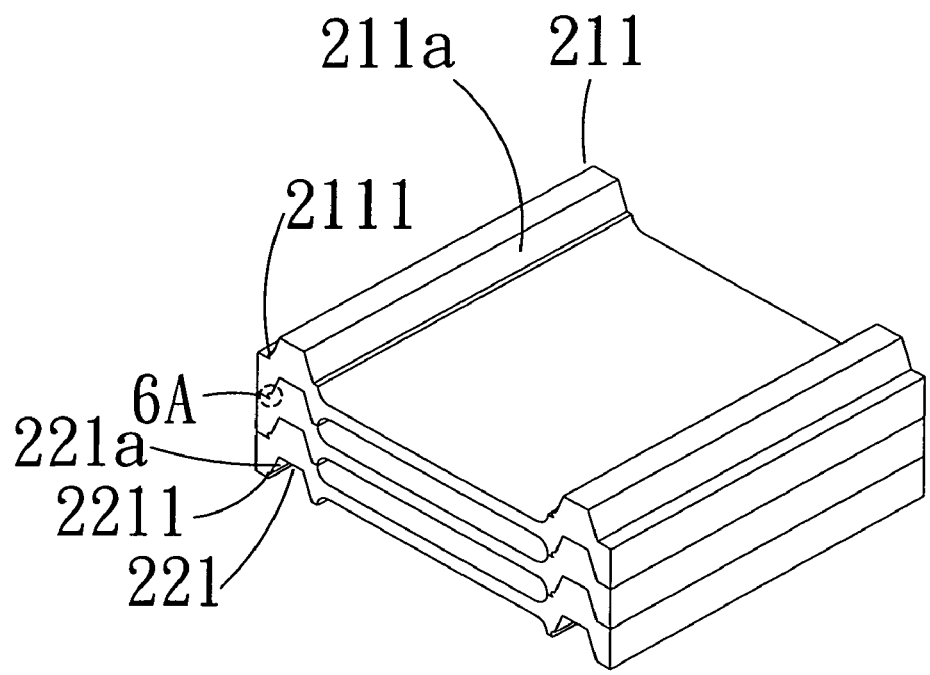
FIG. 6 is an assembled view of FIG. 5.

Please refer to FIGS. 5 and 6 that are exploded and assembled perspective views, respectively, of a sectional modular heat sink according to a second embodiment of the present invention, and to FIG. 6A that is an enlarged view of the circled area 6A in FIG. 6. As shown, the second embodiment is generally structurally similar to the first embodiment, except that each of the ridge portions 211 is provided along the lower edge of at least one of the two inclined sidewalls 211a with a flange 2211, and each of the channels 221 is provided along the lower edge of at least one of the two inclined sidewalls 221a with a groove 2111. Therefore, two modular heat radiating units in the second embodiment may be firmly and stably connected to one another through the engagement of the ridge portions 211 and the flanges 2211 on the first modular heat radiating unit with the channels 221 and the grooves 2111 on the second modular heat radiating unit, respectively.

Figure 7:
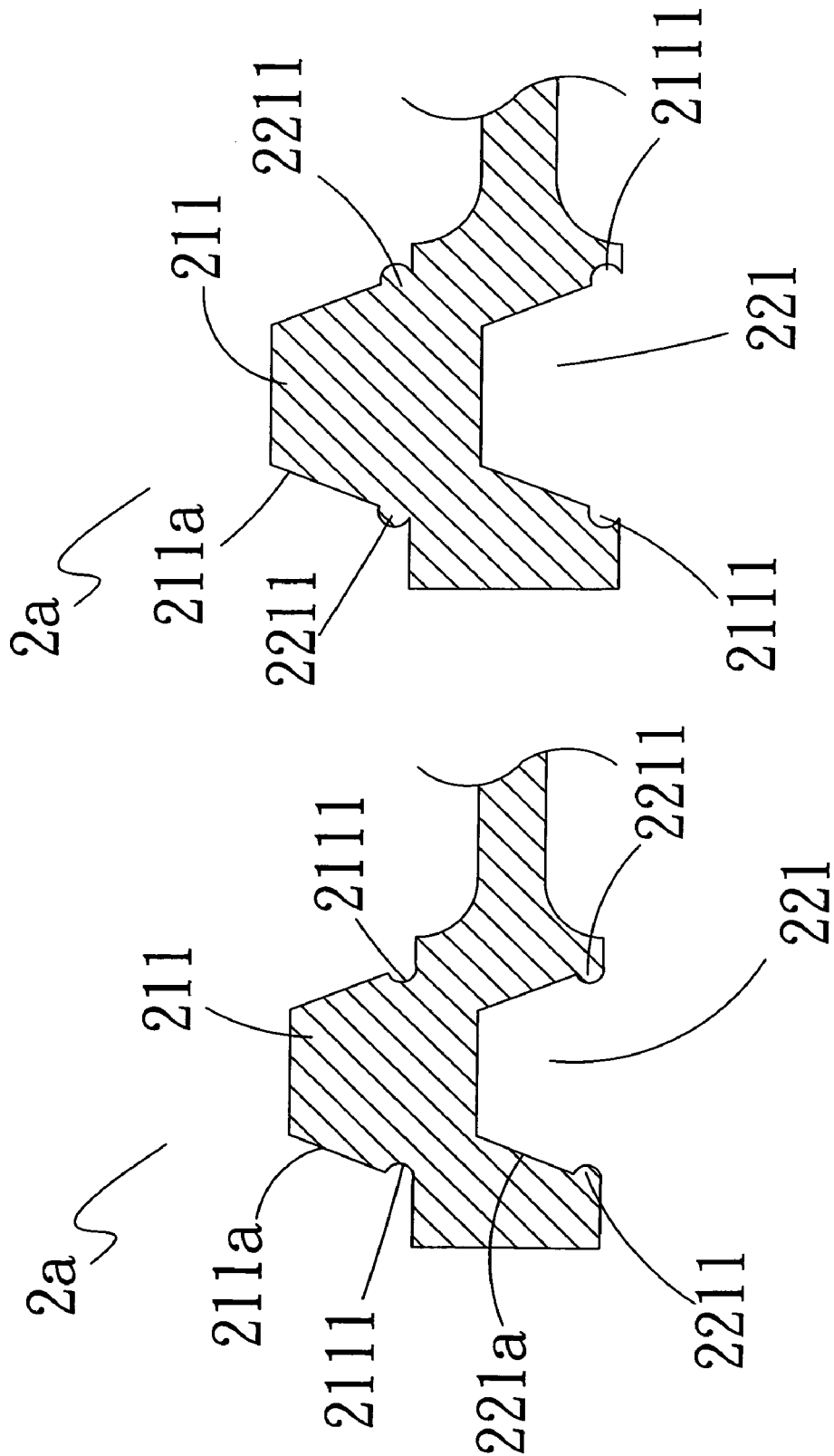
FIGS. 7A and 7B are fragmentary cross-sectional views of two modular heat radiating units for forming sectional modular heat sinks according to a third and a fourth embodiment of the present invention, respectively.

FIGS. 7A and 7B are fragmentary cross-sectional views of two modular heat radiating units 2a according to a third and a fourth embodiment of the present invention, respectively. As shown, in the modular heat radiating unit 2a according to the third embodiment as shown in FIG. 7A, each of the ridge portions 211 is provided along the lower edges of both inclined sidewalls 211a with a groove 2111 each, and each of the channels 221 is provided along the lower edges of both inclined sidewalls 221a with a flange 2211 each. And, in the modular heat radiating unit 2a according to the fourth embodiment as shown in FIG. 7B, each of the ridge portions 211 is provided along the lower edges of both inclined sidewalls 211a with a flange 2211 each, and each of the channels 221 is provided along the lower edges of both inclined sidewalls 221a with a groove 2111 each. Both of the modular heat radiating units 2a in the third and the fourth embodiment can be sequentially stacked and connected to form a firm and stable sectional modular heat sink 2.

Figure 8:
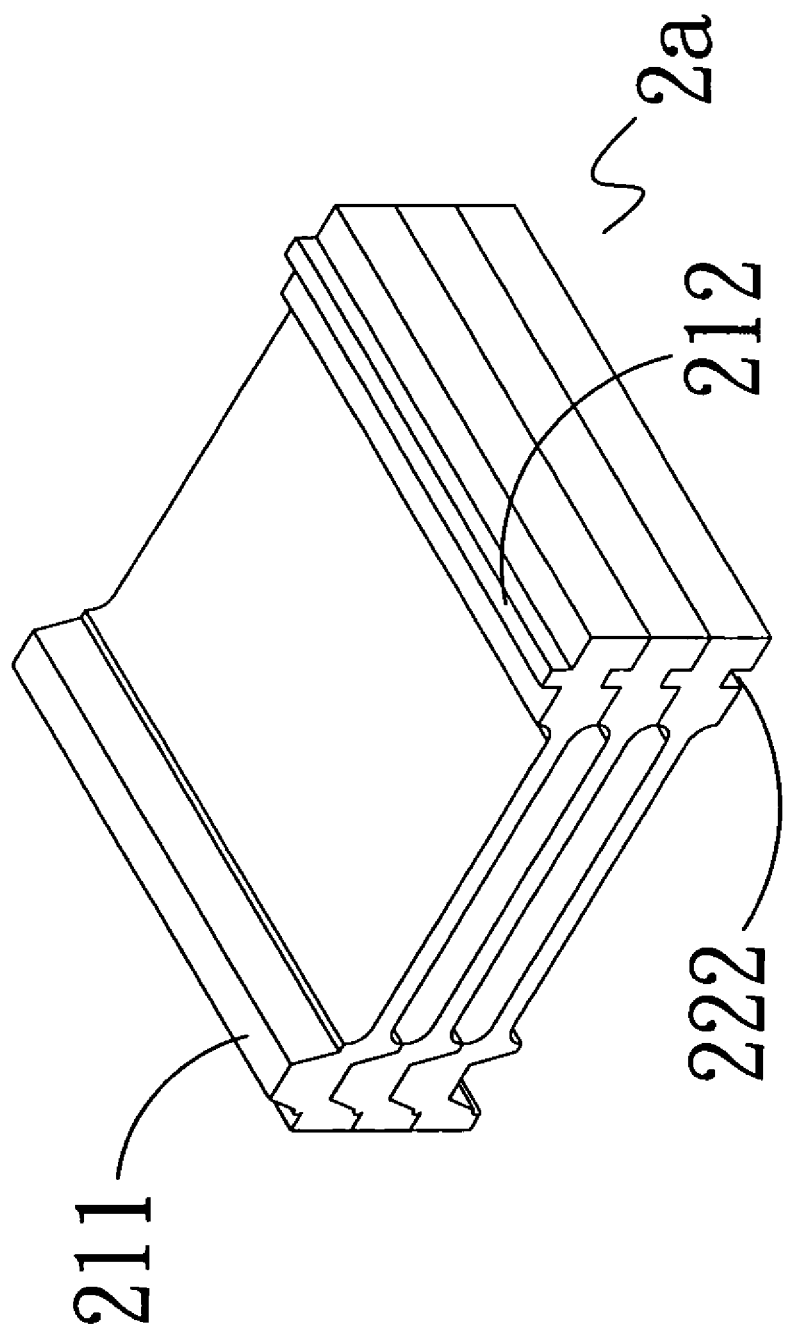
FIG. 8 is an assembled perspective view of a sectional modular heat sink assembled from a plurality of modular heat radiating units according to a fifth embodiment of the present invention.

FIG. 8 is an assembled perspective view of a sectional modular heat sink according to a fifth embodiment of the present invention. The sectional modular heat sink in the fifth embodiment is generally structurally similar to those in the first to fourth embodiments.

However, each of the modular heat radiating units 2a for the sectional modular heat sink in the fifth embodiment is provided on the first plane along only one longitudinal edge with the ridge portion 211 having two inclined sidewalls. Along the other longitudinal edge of the modular heat radiating unit 2a, there is provided a rail portion 212 having two vertical sidewalls. Meanwhile, a slot 222 is provided on the second plane corresponding to the rail portion 212. When two modular heat radiating units 2a are assembled together, the engagement of the rail portion 212 on a first modular heat radiating unit 2a with the slot 222 on a second modular heat radiating unit 2a may further prevent the two modular heat radiating units 2a from moving relative to one another.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A sectional modular heat sink, comprising:
    a plurality of modular heat radiating units, each of the modular heat radiating units being provided on a first plane with at least one longitudinal edge with an upright ridge portion having flat ridge top and two sidewalls extending downwardly and outwardly from the flat ridge top;
    a second plane opposite to the first plane with a channel corresponding to the ridge portion, the channel having a flat top and two sidewalls extending downwardly and outwardly from the flat top having the same gradient as the two sidewalls of the ridge portion; whereby a plurality of the modular heat radiating units may be sequentially stacked and connected to one another to form the sectional modular heat sink through engagement of the ridge portion on a first modular heat radiating unit with the channel on a second modular heat radiating unit;
    a groove located along at least one of the two sidewalls of the ridge portion, and
    a flange along at least one of the two sidewalls of the channel corresponding to the groove on the ridge portion, such that when the plurality of modular heat radiating units are stacked and connected to one another, the groove on a first modular heat radiating unit is engaged with the flange on a second modular heat radiating unit.

2. The sectional modular heat sink as claimed in claim 1, wherein at least one of the two sidewalls of the ridge portion is provided along a predetermined position with a flange, and at least one of the two sidewalls of the channel is provided along a predetermined position with a groove corresponding to the flange on the ridge portion, such that when the plurality of modular heat radiating units are stacked and connected to one another, the flange on a first modular heat radiating unit is engaged with the groove on a second modular heat radiating unit.

\* \* \* \* \*